(12) United States Patent
Chen et al.

(10) Patent No.: US 11,558,020 B2
(45) Date of Patent: Jan. 17, 2023

(54) TRANSMISSION CIRCUIT AND TRANSMISSION SIGNAL STRENGTH ADJUSTING METHOD THEREOF

(71) Applicant: Realtek Semiconductor Corporation, Hsinchu (TW)

(72) Inventors: Beng-Meng Chen, Hsinchu (TW); Chien-Jung Huang, Hsinchu (TW); Yi-Hua Lu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/364,982

(22) Filed: Jul. 1, 2021

(65) Prior Publication Data
US 2022/0149798 A1    May 12, 2022

(30) Foreign Application Priority Data
Nov. 12, 2020    (TW) .................... 109139586

(51) Int. Cl.
*H03F 3/24* (2006.01)
*H04B 1/04* (2006.01)
*H03M 1/12* (2006.01)

(52) U.S. Cl.
CPC ............. *H03F 3/24* (2013.01); *H03M 1/12* (2013.01); *H04B 1/04* (2013.01); *H03F 2200/435* (2013.01); *H04B 2001/0408* (2013.01)

(58) Field of Classification Search
CPC .. G01R 1/44; G01R 21/00; H03F 1/02; H03F 1/26; H03F 1/30; H03F 1/32; H03F 3/04; H03F 3/19; H03F 3/21; H03F 3/24; H03F 2200/435; H03G 3/00; H03G 3/20; H03G 11/00; H03M 1/12; H04B 1/04; H04B 17/00; H04B 17/13
USPC ................... 330/2, 127, 129, 136, 149, 297; 375/295–297; 455/95, 127.1, 127.2
See application file for complete search history.

(56) References Cited

U.S. PATENT DOCUMENTS

| | | | |
|---|---|---|---|
| 8,841,697 B2* | 9/2014 | Mizushima | H01L 29/8725 257/283 |
| 9,559,639 B2* | 1/2017 | Su | H03F 3/24 |
| 11,082,013 B2* | 8/2021 | Maa | H03F 1/0211 |
| 2012/0194271 A1* | 8/2012 | Yamamoto | H03F 1/3247 330/149 |

(Continued)

*Primary Examiner* — Shawkat M Ali
(74) *Attorney, Agent, or Firm* — Locke Lord LLP; Tim Tingkang Xia, Esq.

(57) ABSTRACT

A transmission circuit includes a power amplifier, a power amplifier forestage circuit and a signal strength adjusting circuit. The power amplifier is configured to amplify an input signal to output an output signal. The power amplifier forestage circuit is configured to output the input signal. The signal strength adjusting circuit includes a conversion circuit, a processing circuit and a storage unit. The conversion circuit is configured to convert the voltage of the output signal into an operation value. The processing circuit is configured to perform an operation according to a target index value stored by the storage unit and the operation value to obtain a differential value. The processing circuit is further configured to adjust the input signal outputted by the power amplifier forestage circuit according to the differential value, so that the power of the output signal is maintained at a target power value.

19 Claims, 6 Drawing Sheets

(56) References Cited

U.S. PATENT DOCUMENTS

2012/0326777 A1\* 12/2012 Onishi .................. H03F 1/3247
330/2
2014/0065990 A1 3/2014 Chan et al.
2018/0092048 A1\* 3/2018 Cheng .................... H04B 17/13

\* cited by examiner

US 11,558,020 B2

TRANSMISSION CIRCUIT AND TRANSMISSION SIGNAL STRENGTH ADJUSTING METHOD THEREOF

CROSS-REFERENCE TO RELATED APPLICATION

This application claims priority to Taiwan Application Serial Number 109139586, filed Nov. 12, 2020, which is herein incorporated by reference in its entirety.

BACKGROUND

Field of Invention

This disclosure relates to a transmission circuit and transmission signal strength adjusting method thereof, and in particular to a transmission circuit and transmission signal strength adjusting method for preventing power amplifier from damage.

Description of Related Art

In the high-level manufacture process, the transistors (e.g. metal oxide semiconductor (MOS)) in the power amplifier of the conventional transmission circuit have thin oxide layer. Therefore, when the power amplifier receives the input signal with high voltage, the oxide layer in the transistor can be easily broke so as to damages the power amplifier. Accordingly, the transmission circuit would be unavailable completely.

SUMMARY

An aspect of present disclosure relates to a transmission circuit. The transmission circuit includes a power amplifier, a power amplifier forestage circuit and a signal strength adjusting circuit. The power amplifier is configured to amplify an input signal to output an output signal. The power amplifier forestage circuit is coupled to the input end of the power amplifier and is configured to output the input signal to the power amplifier. The signal strength adjusting circuit includes a conversion circuit, a determination circuit, a processing circuit and a storage unit, wherein the conversion circuit is coupled to the output end of the power amplifier, the determination circuit is coupled to the input end of the power amplifier, the processing circuit is coupled to the power amplifier forestage circuit, the conversion circuit, the determination circuit and the storage unit. The conversion circuit is configured to convert the voltage of the output signal into an operation value. The processing circuit is configured to perform an operation according to a target index value of a plurality of index values stored by the storage unit and the operation value to obtain a differential value. The processing circuit is further configured to adjust the input signal outputted by the power amplifier forestage circuit according to the differential value, so that the power of the output signal is maintained at a target power value.

Another aspect of present disclosure relates to a transmission signal strength adjusting method. The transmission signal strength adjusting method includes: converting the voltage of an output signal outputted by a power amplifier into an operation value; performing an operation according to a target index value of a plurality of index values stored by a storage unit and the operation value to obtain a differential value; adjusting an input signal received by the power amplifier according to the differential value, so that the output signal is maintained to have a target power value; comparing the voltage of the input signal with a predetermined voltage to obtain a comparison result; outputting a determination signal according to the comparison result; and determining whether to revise the target power value according to the level of the determination signal and a register value.

DETAILED DESCRIPTION

The embodiments are described in detail below with reference to the appended drawings to better understand the aspects of the present disclosure. However, the provided embodiments are not intended to limit the scope of the disclosure, and the description of the structural operation is not intended to limit the order in which they are performed. Any device that has been recombined by components and produces an equivalent function is within the scope covered by the disclosure.

The terms used in the entire specification and the scope of the patent application, unless otherwise specified, generally have the ordinary meaning of each term used in the field, the content disclosed herein, and the particular content.

The terms "coupled" or "connected" as used herein may mean that two or more elements are directly in physical or electrical contact, or are indirectly in physical or electrical contact with each other. It can also mean that two or more elements interact with each other.

Figure 1:
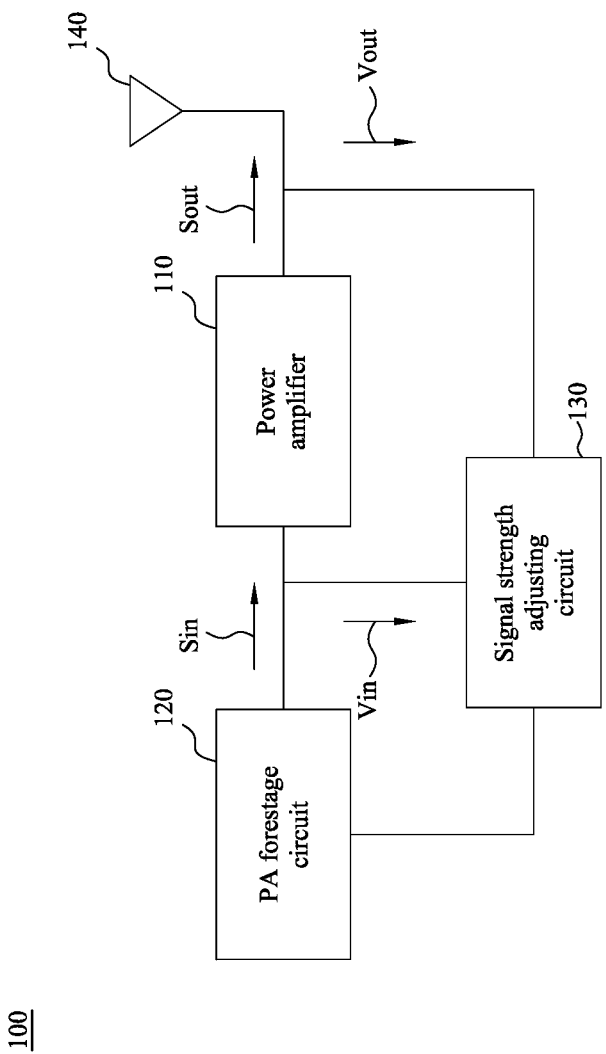
FIG. 1 is a block diagram of the transmission circuit in accordance with some embodiments of the present disclosure.

Referring to FIG. 1, an embodiment of the present disclosure relates to a transmission circuit 100. The transmission circuit 100 includes a power amplifier 110, a power amplifier forestage circuit 120 and a signal strength adjusting circuit 130. The power amplifier 110 is configured to receive an input signal Sin from the power amplifier forestage circuit 120, so as to output an output signal Sout to an antenna 140. The signal strength adjusting circuit 130 is configured to adjust the power of the input signal Sin outputted by the power amplifier forestage circuit 120 according to the voltage Vin of the input signal Sin and the voltage Vout of the output signal Sout.

In structure, the power amplifier forestage circuit 120 is coupled to the input end of the power amplifier 110. The signal strength adjusting circuit 130 is coupled to the output end of the power amplifier 110, the input end of the power amplifier 110 and the power amplifier forestage circuit 120.

Figure 2:
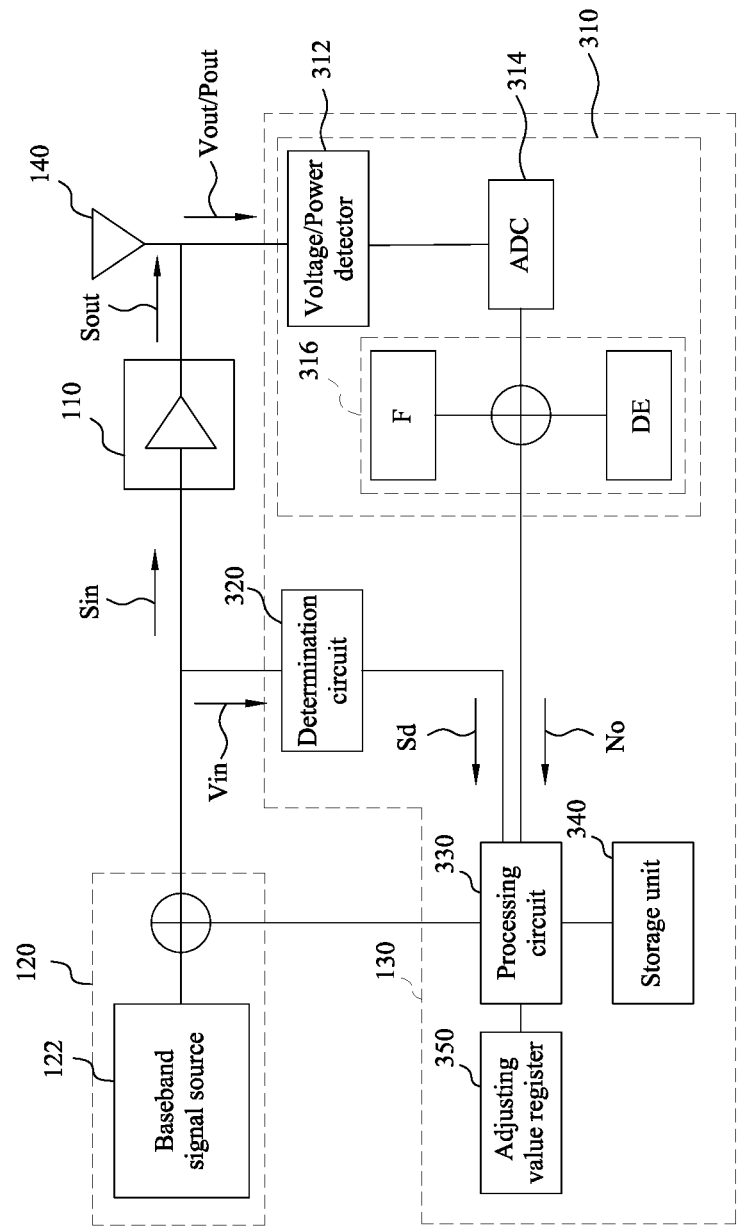
FIG. 2 is a schematic diagram of the transmission circuit in accordance with some embodiments of the present disclosure.

Referring to FIG. 2, in particular, the signal strength adjusting circuit 130 includes a conversion circuit 310, a determination circuit 320, a processing circuit 330, a storage unit 340 and an adjusting value register 350. The conversion circuit 310 is coupled to the output end of the power amplifier 110. The determination circuit 320 is coupled to the input end of the power amplifier 110. The processing circuit 330 is coupled to the power amplifier forestage circuit 120, the determination circuit 320, the conversion circuit 310, the storage unit 340 and the adjusting value register 350.

In the present embodiment, the power amplifier forestage circuit 120 includes a baseband signal source 122. The conversion circuit 310 includes a voltage/power detector 312, an analog-to-digital convertor (ADC) 314 and a normalization circuit 316. The voltage/power detector 312 is coupled to the output end of the power amplifier 110. The analog-to-digital convertor 314 is coupled to the voltage/power detector 312. The normalization circuit 316 is coupled to the analog-to-digital convertor 314 and the processing circuit 330 and includes an environment calibration unit F and an offset calibration unit DE. The determination circuit 320 can be implemented by the peak detector (not shown) or the comparator (not shown).

Figure 3:
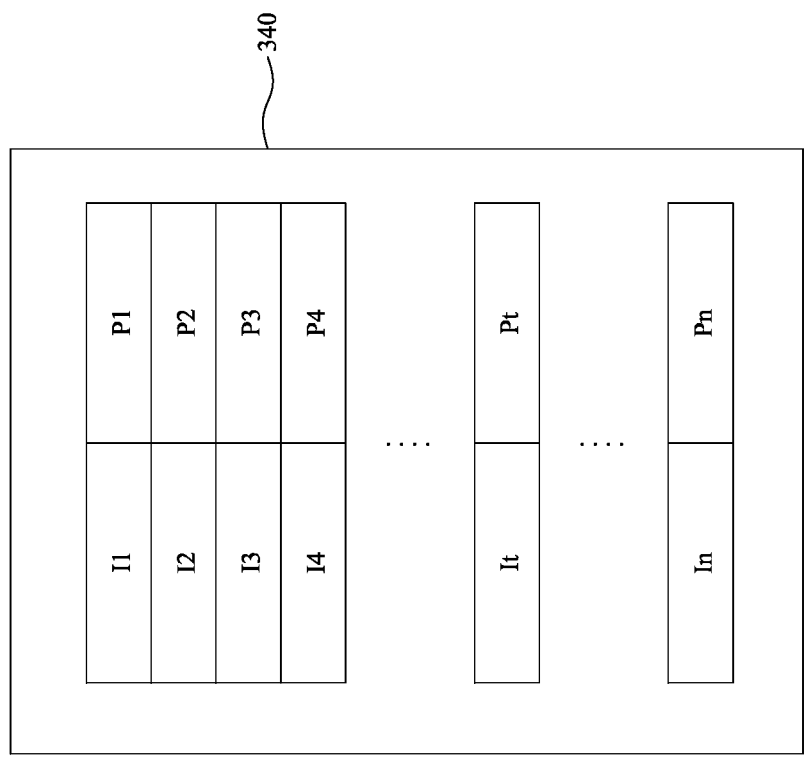
FIG. 3 is a schematic diagram of the storage unit of the transmission circuit in accordance with some embodiments of the present disclosure.

Referring to FIG. 3, the storage unit 340 is configured to store a plurality of index values I1-In and a plurality of power values A1-An corresponding to the index values I1-In. It is worth noting that the processing circuit 330 can assign one of the power values A1-An as a target power value (e.g. power value At) according to a command (not shown) from the user. The processing circuit 330 can also assign the index value Pt corresponding to the power value At as a target index value.

During the operation, the power amplifier forestage circuit 120 outputs the input signal Sin to the power amplifier 110. The power amplifier 110 receives and amplifies the input signal Sin, so as to output the output signal Sout to the antenna 140. It is understood that the power of the output signal Sout is usually changed because of the variation of some environmental factors (e.g. impedance, temperature). For maintaining the output signal Sout at the target power value At, the transmission circuit 100 would adjust the power of the input signal Sin through the feedback path from the output end of the power amplifier 110.

On the feedback path of the output end of the power amplifier 110, the conversion circuit 310 detects the voltage Vout of the output signal Sout. As shown in FIG. 2, the voltage/power detector 312 (i.e., the peak detector) detects the peak value of the voltage Vout of the output signal Sout. The analog-to-digital convertor 314 converts the peak value of the voltage Vout of the output signal Sout from the analog format to the digital format, so as to output a digital peak value (not shown). The normalization circuit 316 normalizes the digital peak value by the environment calibration unit F and the offset calibration unit DE, so as to output an operation value No. In other words, the conversion circuit 310 converts the voltage Vout of the output signal Sout into the operation value No and outputs the operation value No to the processing circuit 330.

In the present embodiment, the operation value No outputted by the conversion circuit 310 would be same as one of the index values I1-In. For example, the index value I1 is 0, the index value I2 is 1, the index value I3 is 2 . . . , and the index value In is 127. The operation value No might be any value from 0 to 127.

If the power of the output signal Sout is not at the target power value At, the operation value No would not be same as the target index value It. It is assumed that the operation value No is same as the index value I76. The processing circuit 330 reads the index value I76 according to the operation value No, so as to obtain the power value A76 corresponding to the index value I76. The processing circuit 330 also calculates a differential value (not shown) according to the power value A76 and the target power value At. After the differential value is obtained, the processing circuit 330 can change the parameter setting of the baseband signal source 122 in the power amplifier forestage circuit 120 according to the differential value, so as to adjust the power of the input signal Sin. By repeating the above-described operation, the output signal Sout would be maintained at the target power value At.

It is assumed that the gain of the power amplifier 110 is 10 dBm, the power of the input signal Sin is 16 dBm, the power value A76 is 26 dBm, and the target power value At is 30 dBm. The processing circuit 330 subtracts the target power value At by the power value A76, so as to obtain the result that the differential value is 4 dBm. For increasing the power of the output signal Sout from 26 dBm to 30 dBm, the processing circuit 330 adjusts the power amplifier forestage circuit 120 according to the differential value. Accordingly, the power of the input signal Sin is increased from 16 dBm to 20 dBm.

If the operation value No outputted by the conversion circuit 310 is same as the target index value It, it means that the power of the output signal Sout is at the target power value At. Therefore, the processing circuit 330 is not required to adjust the input signal Sin.

In addition, for preventing the power amplifier 110 from damage caused by the over power of the input signal Sin, the transmission circuit 100 would adjust the power of the input signal Sin through the feedback path from the input end of the power amplifier 110.

On the feedback path of the input end of the power amplifier 110, the determination circuit 320 detects the voltage Vin of the input signal Sin. As shown in FIG. 2 again, the determination circuit 320 compares the voltage Vin of the input signal Sin with a predetermined voltage (not shown), so as to obtain a comparison result. The determination circuit 320 further outputs a determination signal Sd to the processing circuit 330 according to the comparison result.

Figure 4:
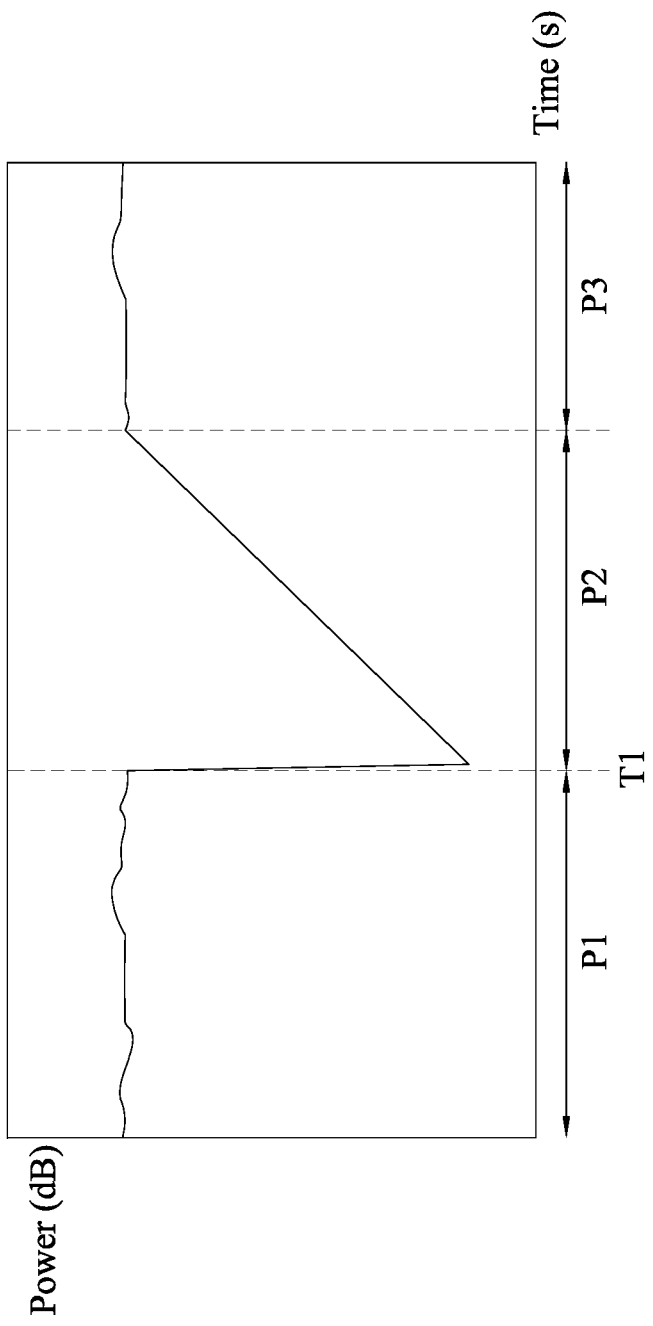
FIG. 4 is a waveform diagram of the power of the output signal of the transmission circuit in accordance with some embodiments of the present disclosure.

In particular, referring to FIG. 4, in the period P1, the determination circuit 320 determines that the voltage Vin of the input signal Sin is less than the predetermined voltage, so as to output the determination signal Sd with a first level (e.g. low voltage level). Also, a register value outputted by the adjusting value register 350 is 0 (it might mean that the adjusting value register 350 does not store any numeral value). The processing circuit 330 continues to execute the above-described operation according to the register value equaling 0 (it represents that the target power value has not been revised) and the determination signal Sd with the first level (it represents that the power of the input signal Sin would not cause the damage to the power amplifier 110), so that the output signal Sout is maintained at the target power value At.

In the time T1, it is assumed that the power of the input signal Sin is increased because of the variation of the environmental factors, and the determination circuit 320 determines that the voltage Vin of the input signal Sin is greater than the predetermined voltage. Accordingly, the determination circuit 320 outputs the determination signal Sd with a second level (e.g. high voltage level). The processing circuit 330 revises the target power value At (for example, decreases from 30 dBm to 23 dBm) stored by the storage unit 340 with a predetermined first adjusting value (e.g. 7 dBm) according to the register value equaling 0 and the determination signal Sd with the second level (it represents that the power of the input signal Sin might cause the damage to the power amplifier 110). In such way, the power of the input signal Sin can be decreased, so as to prevent the power amplifier 110 from damage. Then, the processing circuit 330 updates the register value (for example, updates 0 as −7) stored by the adjusting value register 350 with the first adjusting value. As the processing circuit 330 continues to execute the above-described operation, the power of the input signal Sin would be decreased (for example, decreased from 20 dBm to 13 dBm), so that the power amplifier 110 is prevented from damage.

In the initial phase of the period P2, since the power of the input signal Sin has been decreased, the determination circuit 320 determines that the voltage Vin of the input signal Sin is less than the predetermined voltage, so as to output the determination signal Sd with the first level. The processing circuit 330 revises the target power value At (for example, increases from 23 dBm to 24 dBm) again with a predetermined second adjusting value (e.g. 1 dBm) according to the register value smaller than 0 (it represents that the target power value At has been revised) and the determination signal Sd with the first level. Then, the processing circuit 330 updates the register value (for example, updates −7 as −6) stored by the adjusting value register 350 with the second adjusting value. As the processing circuit 330 continues to execute the above-described operation, the power of the input signal Sin would be increased (for example, increases from 13 dBm to 14 dBm).

In the period P2, the variation of the environmental factors disappears. Therefore, according to the register value smaller than 0 and the determination signal Sd with the first level, the processing circuit 330 repeatedly revises the target power value At (for example, increases from 24 dBm to 30 dBm and increases 1 dBm each time) with the second adjusting value until the target power value At is resumed to be non-revised. Similarly, the processing circuit 330 repeatedly updates the register value (for example, increases from −6 to 0 and increases 1 each time) stored by the adjusting value register 350 with the second adjusting value until the register value becomes 0. As the processing circuit 330 continues to execute the above-described operation, the power of the input signal Sin would be increased slowly (for example, increases from 14 dBm to 20 dBm).

In the period P3, the determination circuit 320 outputs the determination signal Sd with the first level (because the variation of the environmental factors disappears). The processing circuit 330 continues to execute the above-described operation according to the register value equaling 0 and the determination signal Sd with the first level, so that the output signal Sout is maintained at the non-revised target power value At (e.g. 30 dBm).

Figure 5:
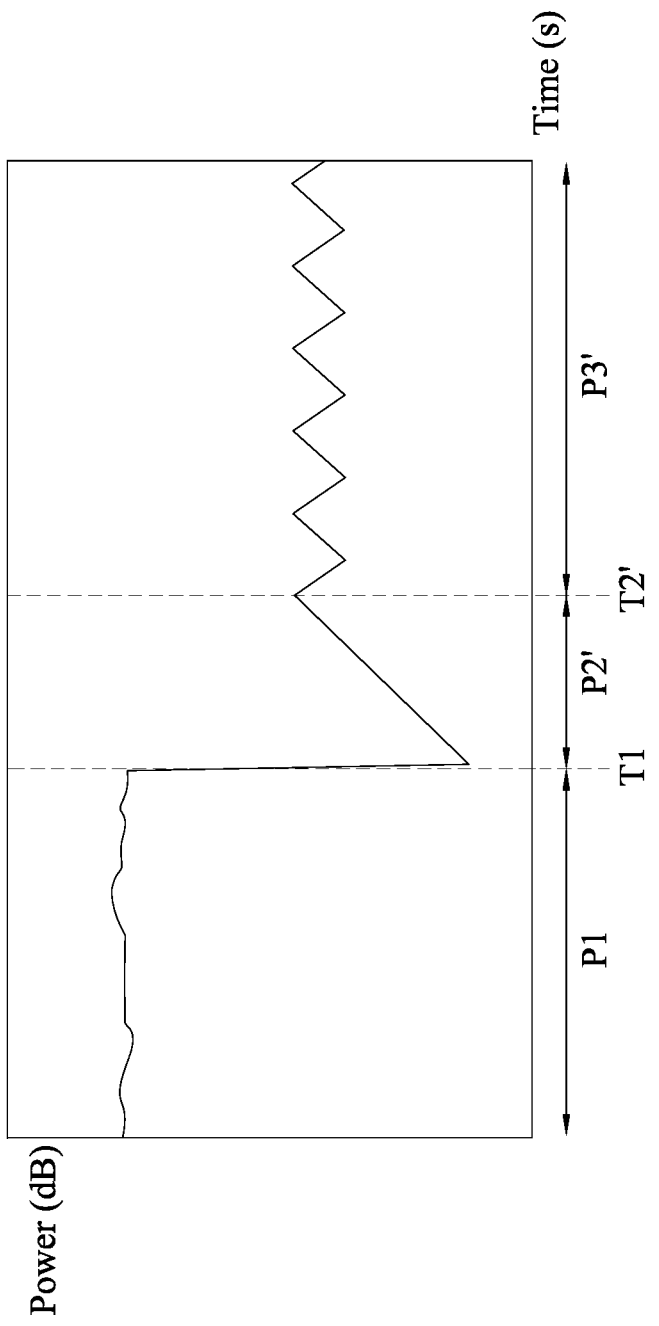
FIG. 5 is another waveform diagram of the power of the output signal of the transmission circuit in accordance with some embodiments of the present disclosure.

Referring to FIG. 5, in another embodiment, in the period P2', the processing circuit 330 still repeatedly revises the target power value At (for example, increases from 23 dBm, increases 1 dBm each time and increases to 27 dBm before near the time T2') with the second adjusting value according to the register value smaller than 0 and the determination signal Sd with the first level. However, in the time T2', since the variation of the environmental factors does not disappear, the determination circuit 320 determines again that the voltage Vin of the input signal Sin is greater than the predetermined voltage and outputs the determination signal Sd with the second level.

In the period P3', the processing circuit 330 revises the target power value At (for example, decreases from 27 dBm to 26 dBm) with a predetermined third adjusting value (e.g. 1 dBm) according to the register value smaller than 0 (e.g. −3) and the determination signal Sd with the second level, so as to decrease the power of the input signal Sin again. Then, since the determination circuit 320 determines that the voltage Vin of the input signal Sin is less than the predetermined voltage, the processing circuit 330 revises the target power value At (for example, increases from 26 dBm to 27 dBm) again with the predetermined second adjusting value (e.g. 1 dBm) according to the register value smaller than 0 (e.g. −4) and the determination signal Sd with the first level. In the period P3', since the variation of the environmental factors does not disappear, the processing circuit 330 would alternatively increase and decrease the target power value At.

Figure 6:
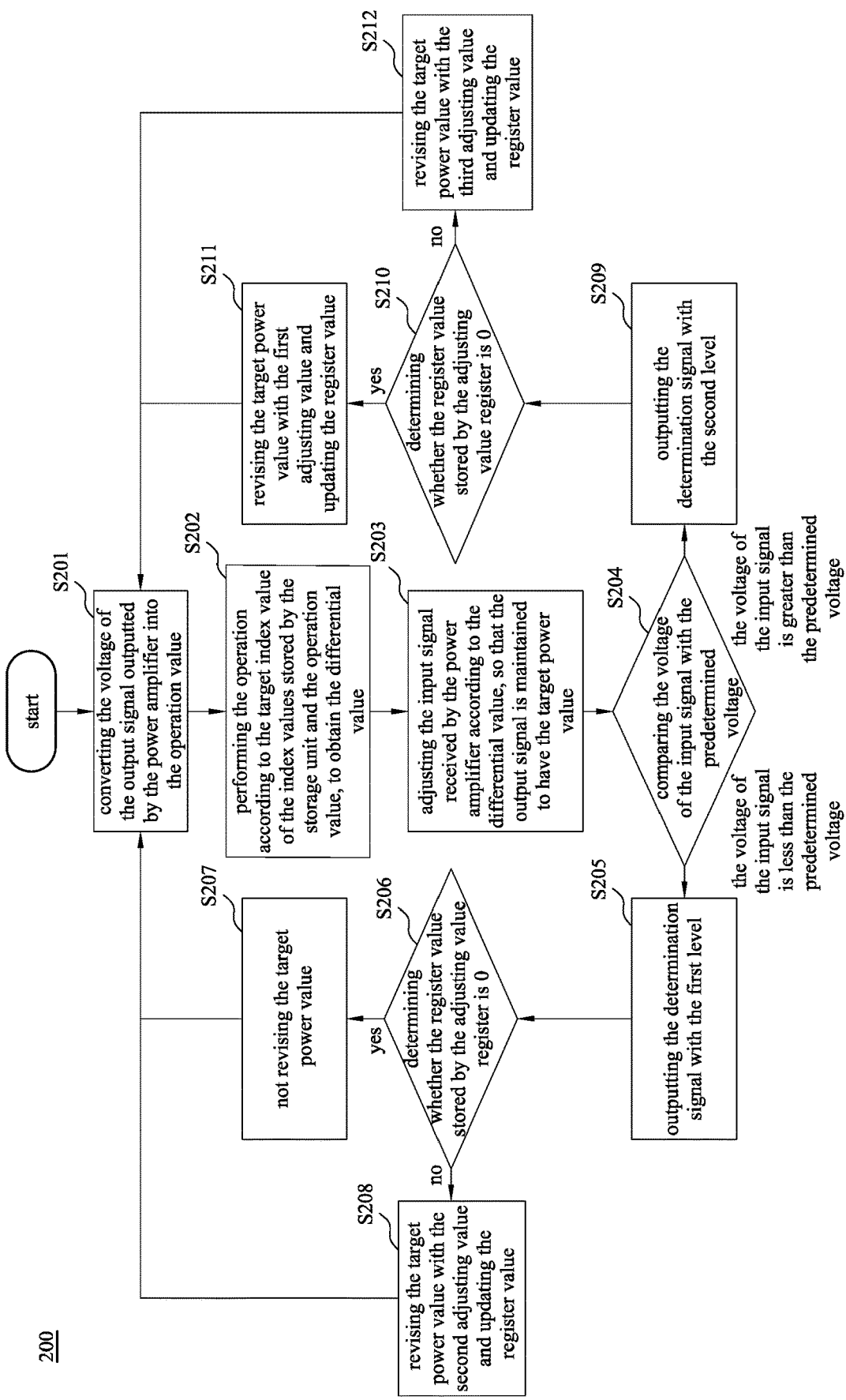
FIG. 6 is a flow diagram of a transmission signal strength adjusting method in accordance with some embodiments of the present disclosure.

Referring to FIG. 6, the present disclosure also provides a transmission signal strength adjusting method 200. The transmission signal strength adjusting method 200 can be applied to the transmission circuit 100 as shown in FIG. 1.

In the step S201, the voltage Vout of the output signal Sout outputted by the power amplifier 110 is converted into the operation value No. In the step S202, the differential value is obtained by performing the operation according to the target index value It of the index values I1-In stored by the storage unit 340 and the operation value No. In the step S203, the input signal Sin received by the power amplifier 110 is adjusted according to the differential value, so that the output signal Sout is maintained at the target power value At.

In the step S204, the voltage Vin of the input signal Sin is compared with the predetermined voltage. When the voltage Vin of the input signal Sin is less than the predetermined voltage, the step S205 is executed to output the determination signal Sd with the first level (e.g. low voltage level). In the step S206, the register value stored by the adjusting value register 350 is determined whether to be 0. When the register value is 0 (e.g. in the period P1 or P3 as shown in FIG. 4), the step S207 is executed to not revise the target power value At. Then, the procedure returns to the step S201. When the register value is not 0 (e.g. in the period P2 as shown in FIG. 4), the step S208 is executed to increase the target power value At with the second adjusting value (e.g. 1 dBm) and to update the register value. Then, the procedure returns to the step S201.

In the step S204, when the voltage Vin of the input signal Sin is greater than the predetermined voltage, the step S209 is executed to output the determination signal Sd with the second level (e.g. high voltage level). In the step S210, the register value stored by the adjusting value register 350 is determined whether to be 0. When the register value is 0 (e.g. at the time T1 as shown in FIG. 4), the step S211 is executed to decrease the target power value At with the first adjusting value (e.g. 7 dBm) and to update the register value. Then, the procedure returns to the step S201. When the register value is not 0 (e.g. at the time T2' as shown in FIG. 5), the step S212 is executed to decrease the target power value At with the third adjusting value (e.g. 1 dBm) and to update the register value. Then, the procedure returns to the step S201.

In the above-described embodiments, the second adjusting value and the third adjusting value are same, and the first adjusting value is greater than the second adjusting value and the third adjusting value. Accordingly, when the power amplifier 110 is endangered for the first time (that is, the determination signal Sd is at the second level and the register value is 0), the input signal Sin can be significantly attenuated by the processing circuit 330 to be within the safe range. When the power amplifier 110 is endangered again in the following time (that is, the determination signal Sd is at the second level and the register value is not 0), the processing circuit 330 can slightly enhance or attenuate the input signal Sin since the input signal Sin has been within the safe range. In such way, at the same time that the power amplifier 110 is protected, the power of the output signal Sout can be increased as high as possible. However, the present disclosure is not limited herein. In another embodiment, the second adjusting value and the third adjusting value are different, but the first adjusting value is still greater than the second adjusting value and the third adjusting value.

In the above embodiments, the voltage/power detector 312 of the conversion circuit 310 detects the peak value of the voltage Vout of the output signal Sout. However, the present disclosure is not limited thereto. Referring to FIG. 2 again, in other embodiments, the voltage/power detector 312 detects the peak value of the power Pout of the output signal Sout for generating the operation value No.

In sum, the present disclosure provides the transmission circuit 100 and the transmission signal strength adjusting method 200 to enhance or attenuate the input signal Sin received by the power amplifier 110 in response to the variation of the environmental factors. Therefore, the power of the output signal Sout of the power amplifier 110 would be maintained at the target power value At. Additionally, the input signal Sin can be attenuated when being over enhanced, so as to prevent the power amplifier 110 from damage. In other words, the transmission circuit 100 and the transmission signal strength adjusting method 200 of the present disclosure can activate the mechanism for protecting power amplifier 110 before the power amplifier 110 might be damaged.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the invention. In view of the foregoing, it is intended that the present invention cover modifications and variations of this invention provided they fall within the scope of the following claims.

What is claimed is:

1. A transmission circuit, comprising:
   a power amplifier configured to amplify an input signal to output an output signal;
   a power amplifier forestage circuit coupled to an input end of the power amplifier and configured to output the input signal to the power amplifier; and
   a signal strength adjusting circuit comprising a conversion circuit, a determination circuit, a processing circuit and a storage unit, wherein the conversion circuit is coupled to an output end of the power amplifier, the determination circuit is coupled to the input end of the power amplifier, the processing circuit is coupled to the power amplifier forestage circuit, the conversion circuit, the determination circuit and the storage unit,
   wherein the conversion circuit is configured to convert a voltage of the output signal into an operation value,
   wherein the processing circuit is configured to perform an operation according to a target index value of a plurality of index values stored by the storage unit and the operation value to obtain a differential value, and
   wherein the processing circuit is further configured to adjust the input signal outputted by the power amplifier forestage circuit according to the differential value, in order that a power of the output signal is maintained at a target power value.

2. The transmission circuit of claim 1, wherein the conversion circuit comprises a peak detector, an analog-to-digital convertor and a normalization circuit, the peak detector is coupled to the output end of the power amplifier and is configured to detect a peak value of the voltage of the output signal,
   the analog-to-digital convertor is coupled to the peak detector and is configured to convert the peak value of the voltage of the output signal from an analog format into a digital format, in order to output a digital peak value, and
   the normalization circuit is coupled to the analog-to-digital convertor and is configured to normalize the digital peak value to output the operation value.

3. The transmission circuit of claim 2, wherein the storage unit further stores a plurality of power values corresponding to the index values, the target power value is corresponding to the target index value, the operation value is same as a first index value of the index values, and
   the processing circuit reads the first index value according to the operation value to obtain a first power value corresponding to the first index value and calculates the differential value according to the first power value and the target power value.

4. The transmission circuit of claim 2, wherein the determination circuit is configured to compare a voltage of the input signal with a predetermined voltage to obtain a comparison result, and is further configured to output a determination signal to the processing circuit according to the comparison result.

5. The transmission circuit of claim 4, wherein when the voltage of the input signal is less than the predetermined voltage, the determination circuit outputs the determination signal with a first level, and
   when the voltage of the input signal is greater than the predetermined voltage, the determination circuit outputs the determination signal with a second level, where the second level is different to the first level.

6. The transmission circuit of claim 5, wherein the signal strength adjusting circuit further comprises an adjusting value register coupled to the processing circuit and configured to store a register value, and
   the processing circuit determines whether to revise the target power value according to the level of the determination signal and the register value.

7. The transmission circuit of claim 6, wherein when the determination signal is at the first level and the register value is 0, the target power value is not revised.

8. The transmission circuit of claim 6, wherein when the determination signal is at the first level and the register value is not 0, the target power value is revised with a second adjusting value, and the register value is updated.

9. The transmission circuit of claim 6, wherein when the determination signal is at the second level and the register value is 0, the target power value is revised with a first adjusting value, and the register value is updated.

10. The transmission circuit of claim 6, wherein when the determination signal is at the second level and the register value is not 0, the target power value is revised with a third adjusting value, and the register value is updated.

11. A transmission signal strength adjusting method, the method comprising:

converting a voltage of an output signal outputted by a power amplifier into an operation value;

performing an operation according to a target index value of a plurality of index values stored by a storage unit and the operation value to obtain a differential value;

adjusting an input signal received by the power amplifier according to the differential value, in order that the output signal is maintained to have a target power value;

comparing a voltage of the input signal with a predetermined voltage to obtain a comparison result;

outputting a determination signal according to the comparison result; and determining whether to revise the target power value according to the level of the determination signal and a register value.

12. The transmission signal strength adjusting method of claim 11, wherein converting the voltage of the output signal into the operation value comprises:

detecting a peak value of the voltage of the output signal;

converting the peak value of the voltage of the output signal from an analog format into a digital format, in order to output a digital peak value; and normalizing the digital peak value to output the operation value.

13. The transmission signal strength adjusting method of claim 11, wherein the storage unit further stores a plurality of power values corresponding to the index values, the target power value is corresponding to the target index value, the operation value is same as a first index value of the index values.

14. The transmission signal strength adjusting method of claim 13, wherein performing the operation according to the target index value and the operation value to obtain the differential value comprises:

reading the first index value according to the operation value to obtain a first power value corresponding to the first index value; and calculating the differential value according to the first power value and the target power value.

15. The transmission signal strength adjusting method of claim 11, wherein outputting the determination signal according to the comparison result comprises:

when the voltage of the input signal is less than the predetermined voltage, outputting the determination signal with a first level; and when the voltage of the input signal is greater than the predetermined voltage, outputting the determination signal with a second level, where the second level is different to the first level.

16. The transmission signal strength adjusting method of claim 15, wherein determining whether to revise the target power value according to the level of the determination signal and the register value comprises:

when the determination signal is at the first level and the register value is 0, the target power value is not revised.

17. The transmission signal strength adjusting method of claim 15, wherein determining whether to revise the target power value according to the level of the determination signal and the register value comprises:

when the determination signal is at the first level and the register value is not 0, the target power value is revised with a second adjusting value, and the register value is updated.

18. The transmission signal strength adjusting method of claim 15, wherein determining whether to revise the target power value according to the level of the determination signal and the register value comprises:

when the determination signal is at the second level and the register value is 0, the target power value is revised with a first adjusting value, and the register value is updated.

19. The transmission signal strength adjusting method of claim 15, wherein determining whether to revise the target power value according to the level of the determination signal and the register value comprises:

when the determination signal is at the second level and the register value is not 0, the target power value is revised with a third adjusting value, and the register value is updated.

* * * * *